(12) United States Patent
Hashemi et al.

(10) Patent No.: US 12,361,995 B2
(45) Date of Patent: Jul. 15, 2025

(54) SPIN-ORBIT-TORQUE (SOT) MRAM WITH DOUBLED LAYER OF SOT METAL

(71) Applicant: International Business Machines Corporation, Armonk, NY (US)

(72) Inventors: Pouya Hashemi, Purchase, NY (US); Christopher Safranski, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 241 days.

(21) Appl. No.: 17/956,938

(22) Filed: Sep. 30, 2022

(65) Prior Publication Data

US 2024/0112712 A1   Apr. 4, 2024

(51) Int. Cl.
*G11C 11/00* (2006.01)
*G11C 11/02* (2006.01)
(Continued)

(52) U.S. Cl.
CPC ............ *G11C 11/161* (2013.01); *G11C 11/02* (2013.01); *G11C 11/08* (2013.01); *G11C 11/15* (2013.01);
(Continued)

(58) Field of Classification Search
CPC ....... G11C 11/161; G11C 11/02; G11C 11/08; G11C 11/15; G11C 11/16; G11C 11/5607;
(Continued)

(56) References Cited

U.S. PATENT DOCUMENTS 9,830,966 B2   11/2017   Mihajlovic
10,381,552 B2   8/2019   Mihajlovic
(Continued)

FOREIGN PATENT DOCUMENTS

CN   110197682 A   9/2019
CN   111052398 A   4/2020
(Continued)

OTHER PUBLICATIONS

Wang,GuangJun, China National Intellectual Property Administration. Counterpart PCT Application PCT/CN2023/094118 ISR & WO, Jun. 23, 2023. pp. 9.
(Continued)

*Primary Examiner* — Tha-O H Bui
(74) *Attorney, Agent, or Firm* — Yuanmin Cai; Otterstedt & Kammer PLLC (57) ABSTRACT

A magnetic random access memory (MRAM) apparatus and method are provided. The apparatus includes a magnetic tunnel junction (MTJ) stack; a spin-orbit-torque (SOT) layer that underlies the MTJ stack; and a dielectric pillar that underlies the SOT layer and the MTJ stack. The SOT layer has a stepped profile. The method includes forming a dielectric base of a first dielectric material and a dielectric pillar of a second dielectric material, wherein the dielectric pillar protrudes from the dielectric base, forming a first intermediate structure by depositing a first layer of conductive material onto the dielectric base, sufficiently thick to cover the pillar and the base, forming a planarized structure by planarizing the first intermediate structure to reveal the pillar, and depositing a second layer of spin-orbit-torque metal onto the planarized structure.

26 Claims, 8 Drawing Sheets

(51) Int. Cl.
    *G11C 11/08*     (2006.01)
    *G11C 11/15*     (2006.01)
    *G11C 11/16*     (2006.01)
    *G11C 11/56*     (2006.01)
    *H10B 61/00*     (2023.01)
    *H10N 50/01*     (2023.01)
    *H10N 50/10*     (2023.01)
    *H10N 50/80*     (2023.01)

(52) U.S. Cl.
    CPC .......... *G11C 11/16* (2013.01); *G11C 11/5607* (2013.01); *H10B 61/00* (2023.02); *H10N 50/01* (2023.02); *H10N 50/10* (2023.02); *H10N 50/80* (2023.02)

(58) Field of Classification Search
    CPC .... G11C 11/1675; H10B 61/00; H10N 50/01; H10N 50/10; H10N 50/80
    USPC ......................................................... 365/158
    See application file for complete search history.

(56) References Cited

U.S. PATENT DOCUMENTS

| | | |
|---|---|---|
| 10,749,016 B2 | 8/2020 | Adelmann |
| 10,749,106 B2 | 8/2020 | Adelmann |
| 11,075,334 B2 | 7/2021 | Reznicek |
| 11,165,013 B2 | 11/2021 | Garello |
| 11,223,008 B2 | 1/2022 | Rizzolo |
| 11,251,362 B2 | 2/2022 | Wu |
| 2017/0330070 A1 | 11/2017 | Sengupta |
| 2019/0207094 A1* | 7/2019 | Gajek .................... H10N 50/10 |
| 2020/0083429 A1* | 3/2020 | Lee ........................ H10N 50/10 |
| 2020/0136023 A1 | 4/2020 | Tsumita |
| 2020/0161542 A1* | 5/2020 | Ahn ....................... H01F 41/307 |
| 2022/0140231 A1 | 5/2022 | Suda |

FOREIGN PATENT DOCUMENTS

| | | |
|---|---|---|
| CN | 111129285 A | 5/2020 |
| CN | 111682106 A | 9/2020 |
| CN | 111864060 A | 10/2020 |

OTHER PUBLICATIONS

Seo Y, Kwon KW, Roy K. Area-efficient SOT-MRAM with a Schottky diode. IEEE Electron Device Letters 37(8):982-5. Aug. 2016.

Garello K, Yasin F, Couet S, Souriau L, Swerts J, Rao S, Van Beek S, Kim W, Liu E, Kundu S, Tsvetanova D. SOT-MRAM 300mm integration for low power and ultrafast embedded memories. In2018 IEEE Symposium on VLSI Circuits Jun. 18, 2018 (pp. 81-82). IEEE.

Garello K, Yasin F, Kar GS. Spin-orbit torque MRAM for ultrafast embedded memories: From fundamentals to large scale technology integration. In2019 IEEE 11th International Memory Workshop (IMW) May 12, 2019 (pp. 1-4). IEEE.

* cited by examiner

SPIN-ORBIT-TORQUE (SOT) MRAM WITH DOUBLED LAYER OF SOT METAL

BACKGROUND

The present invention relates to the electrical, electronic, and computer arts, and more specifically, to fabrication of non-volatile memory.

Figure 1:
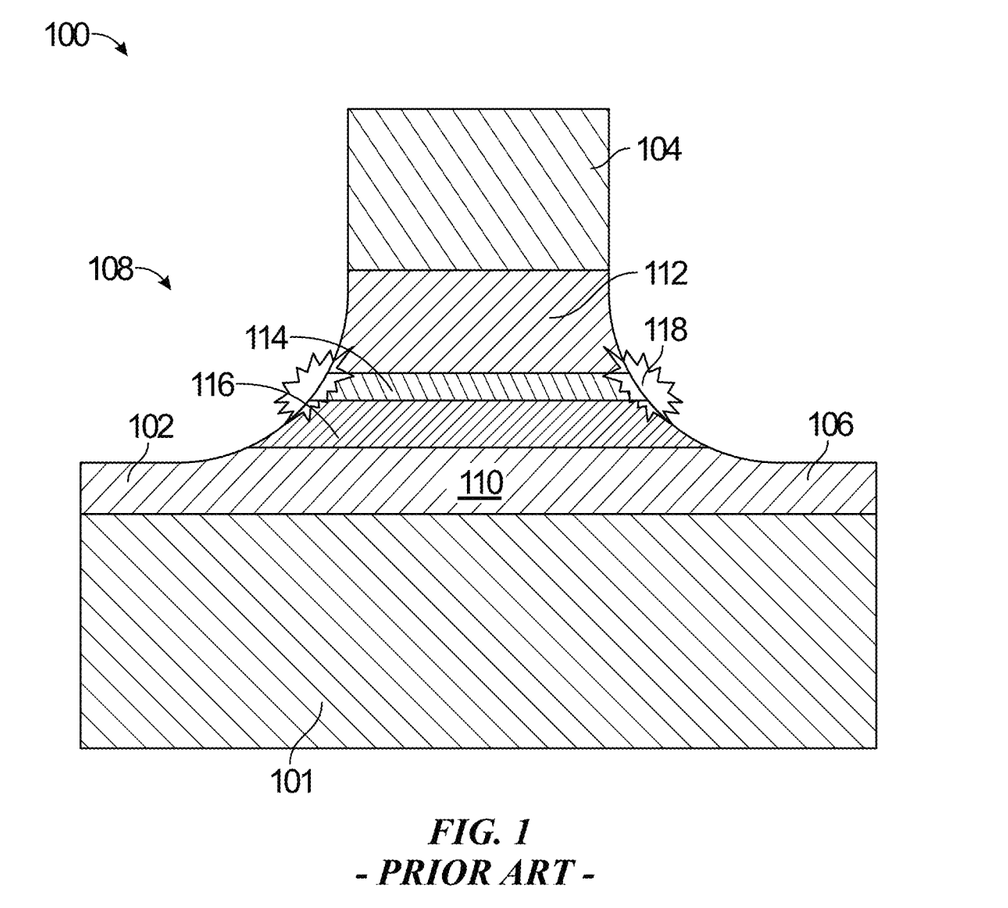
FIG. 1 depicts, in a schematic, an SOT MRAM according to the prior art.

FIG. 1 depicts a main section of spin-orbit-torque (SOT) magnetic random access memory (MRAM memory cell) 100, excluding the bottom electrodes, according to the prior art. The MRAM 100 is formed on a substrate 101. The MRAM 100 includes a top (read) electrode 104, a magnetic tunnel junction (MTJ) stack 108, and a spin-orbit-torque (SOT) layer 110. The SOT layer 110 includes left and right regions 102, 106 that are respectively connected to first (supply) and second (write) bottom electrodes that are out of plane from the drawing view. The MTJ stack 108 includes a pinned layer 112, a barrier layer 114, and a free layer 116. The MRAM 100 SOT induces switching of the free layer 116 (for writing) by injecting an in-plane current from the first bottom electrode to the write electrode in the SOT layer 110 either with or without the assistance of a static in-plane magnetic field. This enables a three terminal MTJ-based concept that isolates the read/write paths, improving the device endurance and read stability. Moreover, due to SOT spin transfer geometry, incubation time is negligible, which allows for reliable switching operation at sub-nanosecond timescales.

Occasionally, the MRAM 100 also, undesirably, has metal bridges 118 across edges of the barrier layer 114. The bridges 118 are further discussed below.

SUMMARY

Principles of the invention provide techniques for spin-orbit-torque (SOT) magnetic random access memory (MRAM) with improved patterning process control. In one aspect, an exemplary magnetic random access memory (MRAM) apparatus includes a magnetic tunnel junction (MTJ) stack; a spin-orbit-torque (SOT) layer that underlies the MTJ stack, wherein the SOT layer has a stepped profile; and a dielectric pillar that underlies the SOT layer and the MTJ stack.

According to another aspect, an exemplary method includes forming a dielectric base of a first dielectric material and a dielectric pillar of a second dielectric material, wherein the dielectric pillar protrudes from the dielectric base; forming a first intermediate structure by depositing a first layer of conductive material onto the dielectric base, sufficiently thick to cover the pillar and the base; forming a planarized structure by planarizing the first intermediate structure to reveal the pillar; and depositing a second layer of spin-orbit-torque metal onto the planarized structure.

According to another aspect, an exemplary magnetic random access memory (MRAM) apparatus includes a magnetic tunnel junction (MTJ) stack; and a spin-orbit-torque (SOT) layer underlying the MTJ stack. The SOT layer has an upper step directly under the MTJ stack and a lower step adjacent to and below the upper step. The upper step comprises spin-orbit-torque metal.

In view of the foregoing, techniques of the present invention can provide substantial beneficial technical effects. For example, one or more embodiments provide one or more of:

An SOT MRAM with enhanced reliability due to reducing the presence of metal bridges on the barrier layer.

An SOT MRAM with enhanced switching time due to improved geometry of the SOT layer.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 5 through FIG. 9 are taken at section line 5 in FIG. 4.

DETAILED DESCRIPTION

In fabricating the SOT MRAM 100 that is shown in FIG. 1, according to conventional methods, there is a step of anisotropic etching (typically, reactive ion etch (RIE) or Ion-Beam-Etch (IBE)) in order to define the MTJ stack 108. During the etching step, metal from the SOT layer 110 sputters and redeposits onto edges of the barrier layer 114. The redeposited metal sometimes forms bridges 118, which electrically shorts the barrier layer 114, thereby rendering the MRAM 100 inoperable.

Figure 2:
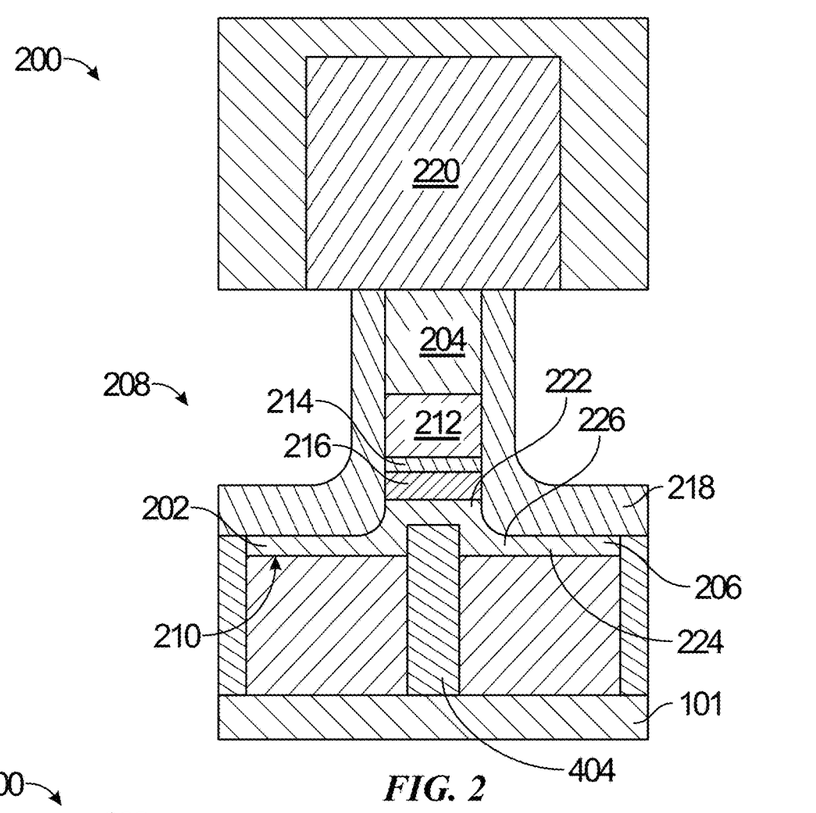
FIG. 2 depicts, in a schematic, an SOT MRAM according to exemplary embodiments.

One or more embodiments advantageously provide a method for making an MRAM that in the first instance does not form bridges across the barrier layer, or that eliminates such bridges in case they are formed. Such an SOT MRAM 200 is shown in FIG. 2; unique intermediate and final structures are disclosed herein.

Initial efforts to provide such methods considered the bridges 118 to be an artifact of "under-etch" on the MTJ stack 108 and SOT layer 110. It was believed that additional etching could eliminate the bridges. However, additional etching led to excessive thinning ("over-etch") of the SOT layer 110, which undesirably increase electrical resistance to read and write operations. In contrast, the MRAM 200 advantageously enables additional etching without excessive thinning of its spin-orbit-torque (SOT) layer 210.

Figure 4:
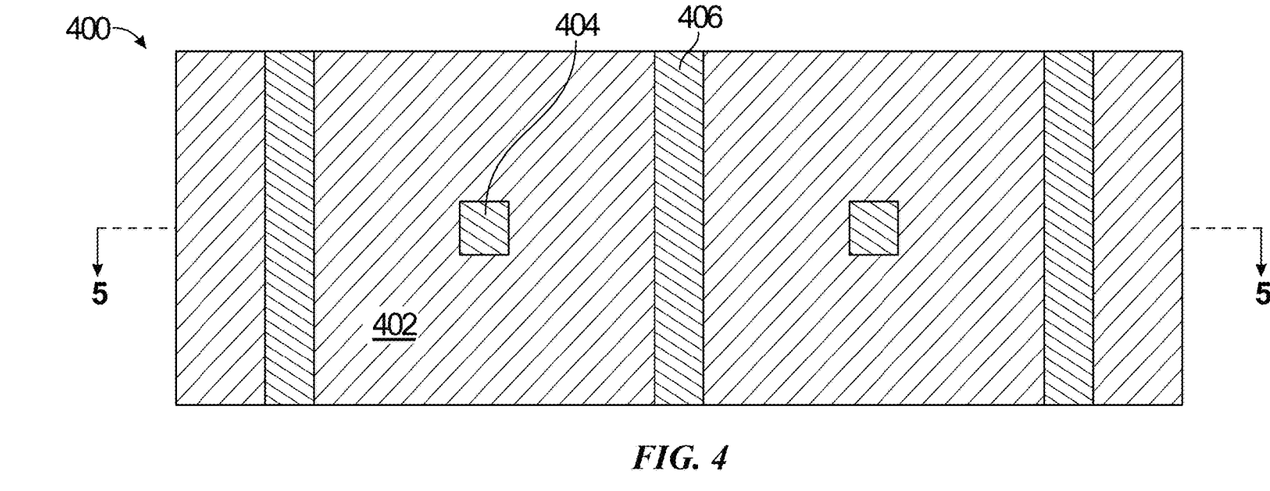
FIG. 4 through FIG. 9 depict, in schematics, structures that are produced by steps of the method that is shown in FIG. 3.
Figure 5:
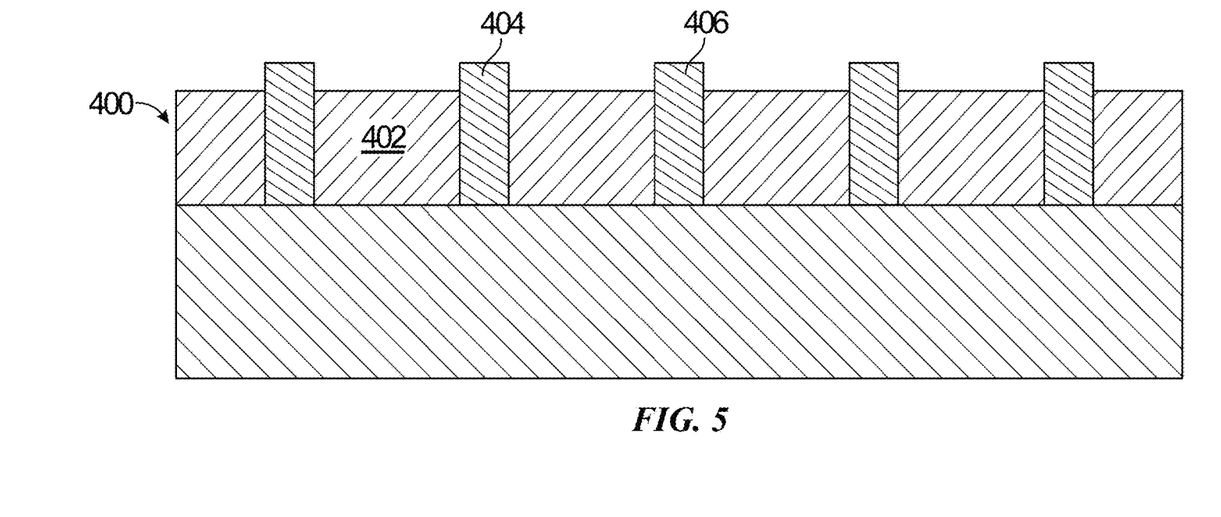

The MRAM 200 includes a top (read) electrode 204, a magnetic tunnel junction (MTJ) stack 208, and the SOT layer 210. The SOT layer 210 includes left and right regions 202, 206 that are respectively connected to first (supply) and second (write) bottom electrodes that are out of plane from the drawing view. The MTJ stack 208 includes a pinned layer 212, a barrier layer 214, and a free layer 216. In the MRAM 200, switching of the free layer 216 (for writing) is induced by injecting an in-plane current through the SOT layer 210 from the supply bottom electrode—to the write electrode, with or without the assistance of a static in-plane magnetic field. The MRAM 200 is disposed atop a dielectric pillar 404, which is further discussed with reference to FIG.

4 and FIG. 5, below. Another dielectric 218 encapsulates the MRAM 200 and insulates it from adjoining memory cells.

Unlike the prior art that is shown in FIG. 1, the SOT layer 210 has a stepped profile with an upper step 222 and lower steps 224 that are joined by risers 226. The steps 222, 224 and the risers 226 are of generally uniform thickness, so that electrical resistance is not impaired. The stepped profile of the SOT layer 210 is produced according to a method 300, which is shown in a flowchart in FIG. 3. Interconnect layer(s) 220 are discussed below.

Semiconductor device manufacturing includes various steps of device patterning processes. For example, the manufacturing of a semiconductor chip may start with a plurality of CAD (computer aided design) generated device patterns, which then are replicated on a substrate. The replication process may involve the use of various exposing techniques and a variety of subtractive (etching) and/or additive (deposition) material processing procedures.

A number of different precursors may be used for the deposition of semiconductor or other materials. In some embodiments, the gas source for the deposition of a material may include silicon (Si) deposited from silane, disilane, trisilane, tetrasilane, hexachlorodisilane, tetrachlorosilane, dichlorosilane, trichlorosilane, disilane and combinations thereof. In other examples, when the material includes germanium, a germanium gas source may be selected from the group consisting of germane, digermane, halogermane, dichlorogermane, trichlorogermane, tetrachlorogermane and combinations thereof. In other examples, when the material includes a metal or a metallic compound, a gas source may include the pure elemental metal, or the metallic compound, as in physical vapor deposition (PVD)/physical vapor transport (PVT) or atomic layer deposition (ALD). Other deposition methods, which also may be suitable for structures that are described herein, include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The various chemical vapor deposition methods typically make use of multiple precursors that react enroute to the deposition surface in order to produce a final composition (which typically has a higher sublimation temperature than the precursors).

Figure 3:
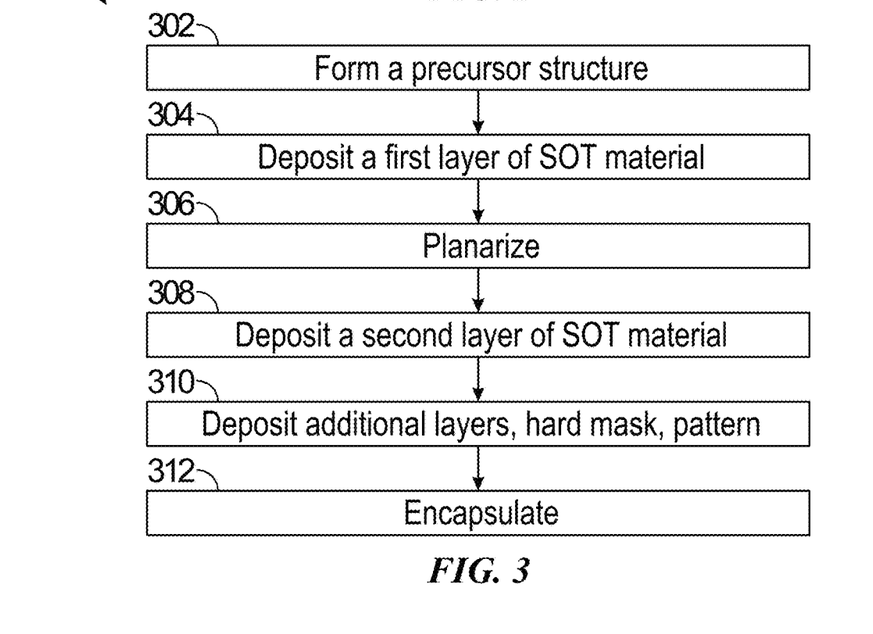
FIG. 3 depicts, in a flowchart, a method for making the SOT MRAM that is shown in FIG. 2.

Referring to FIG. 3, at 302, form a precursor structure 400, which is shown in FIG. 4 and FIG. 5. The structure 400 includes a first dielectric base 402, as well as a second dielectric that is formed into pillars 404 and bars 406. The pillars 404 will provide the base for copies of the MRAM 200 that is shown in FIG. 2. The pillars 404 and the bars 406 protrude from the base 402. The base 402 is made from a different dielectric than the pillars 404 and the bars 406 so that the base can be etched selective to the pillars and bars. Suitable materials for the base 402 include, e.g., silicon nitride, aluminum oxide, hafnium oxide, and the like.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching are well understood by those skilled in the art.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

Figure 6:
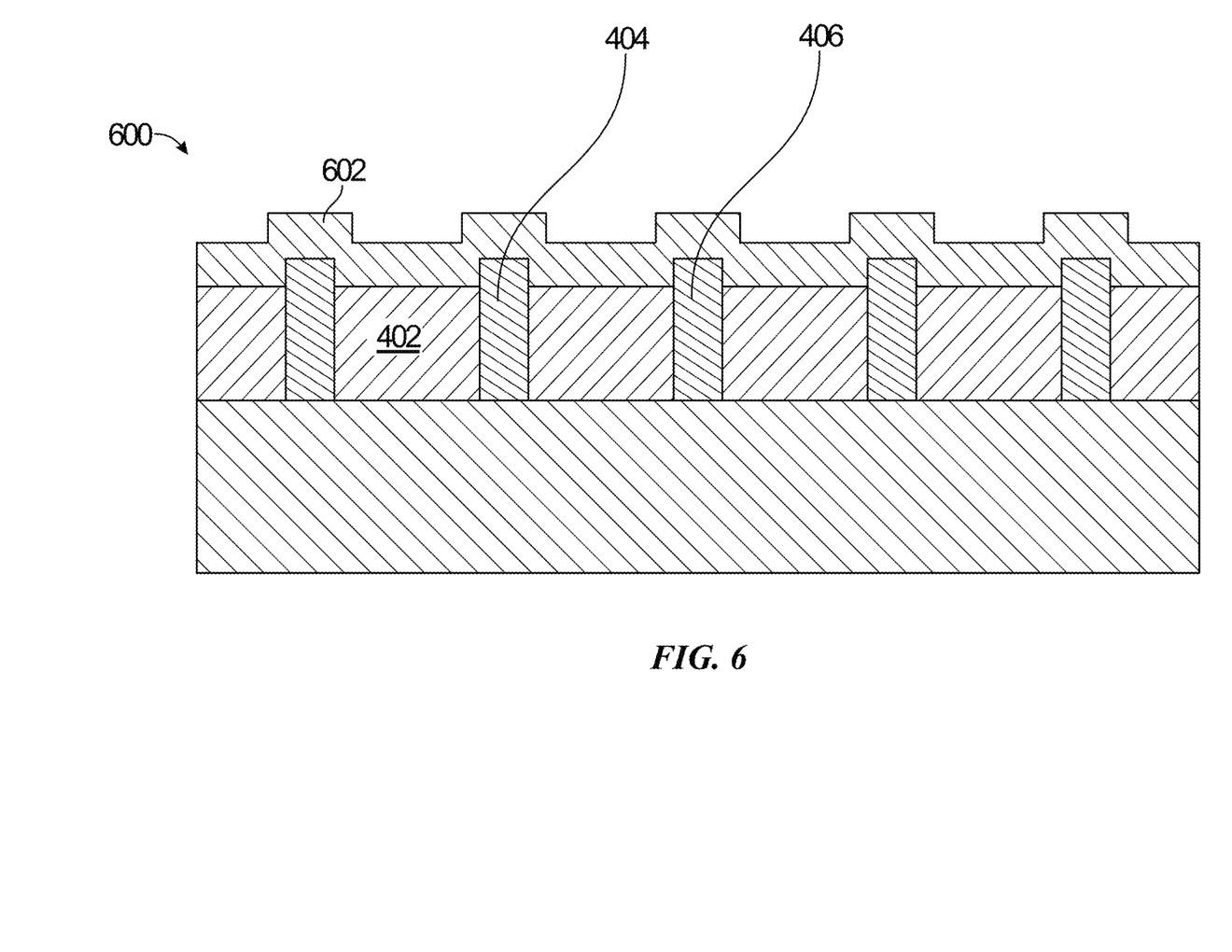

At 304, form a structure 600, which is shown in FIG. 6, by depositing a first layer 602 of material, e.g., spin-orbit-torque metal. The first layer 602 will later form the lower steps 224 that are shown in FIG. 2. In one or more embodiments, suitable SOT materials include, e.g., β-Ta, β-W, $Cu_xPt_{1-x}$, $Cu_{1-x}Ta_x$, $Pd_xPt_{1-x}$, $Au_xPt_{1-x}$, Pt, $Bi_2Se_3$, $WTe_2$, $PtTe_2$, $TaS_2$, $Pt_xRh_{1-x}$, or any metallic alloy with average atomic weight above 80. As mentioned, such materials are suitable for deposition by, e.g., PVD, ALD, or MBE. In structure 600, the first layer 602 covers both the pillars 404 and the bars 406.

It should be noted that in certain embodiments, the first layer 602 need not be spin-orbit-torque metal, but could instead be any conductive material that is compatible with the spin-orbit-torque metal.

Figure 7:
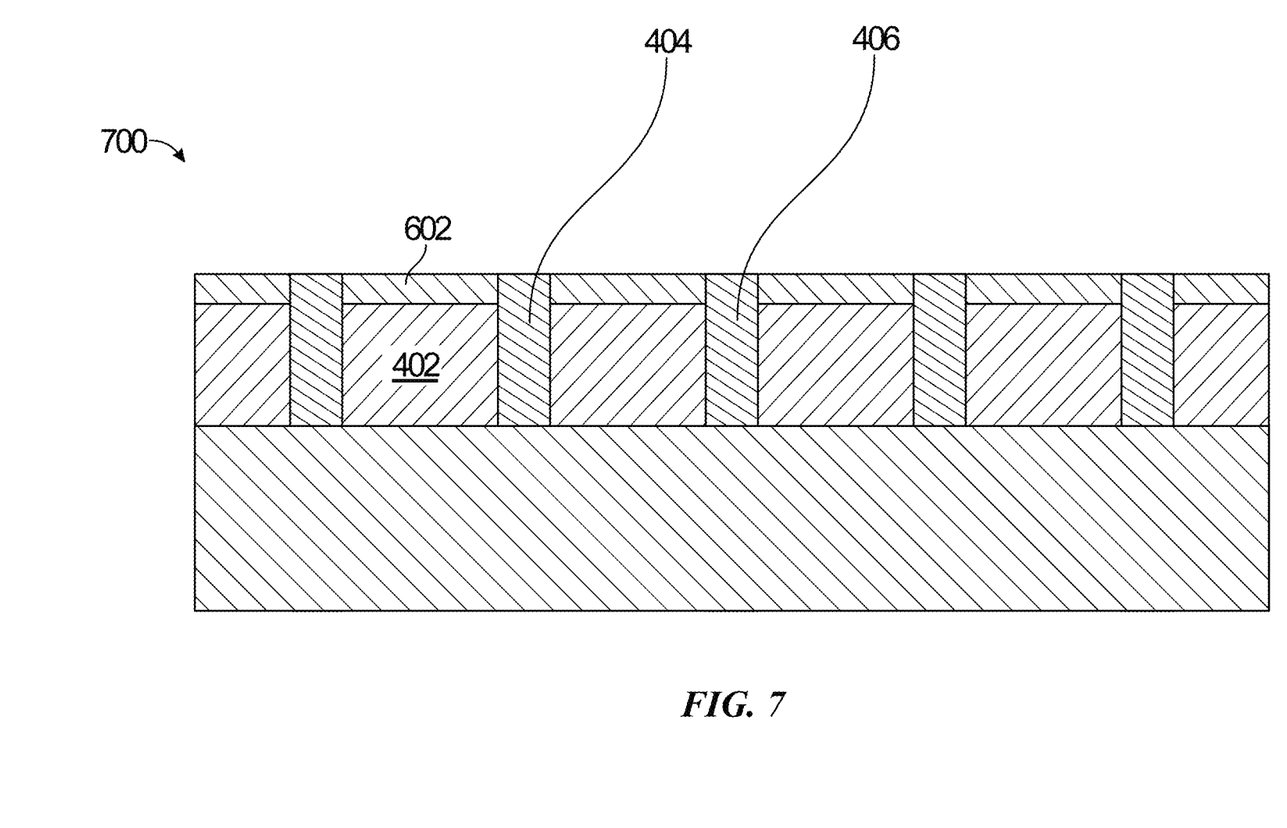

At 306, form a structure 700, which is shown in FIG. 7, by planarizing the structure 600. In one or more embodiments, a method such as chemical-mechanical polishing (CMP) may be used to planarize. In the structure 700, the first layer 602 has been made flush with the tops of the pillars 404 and the bars 406, so that those structures interrupt the first layer 602. Later in the fabrication of the MRAM 200, this results in the bars 406 providing boundaries for the MRAM.

Figure 8:
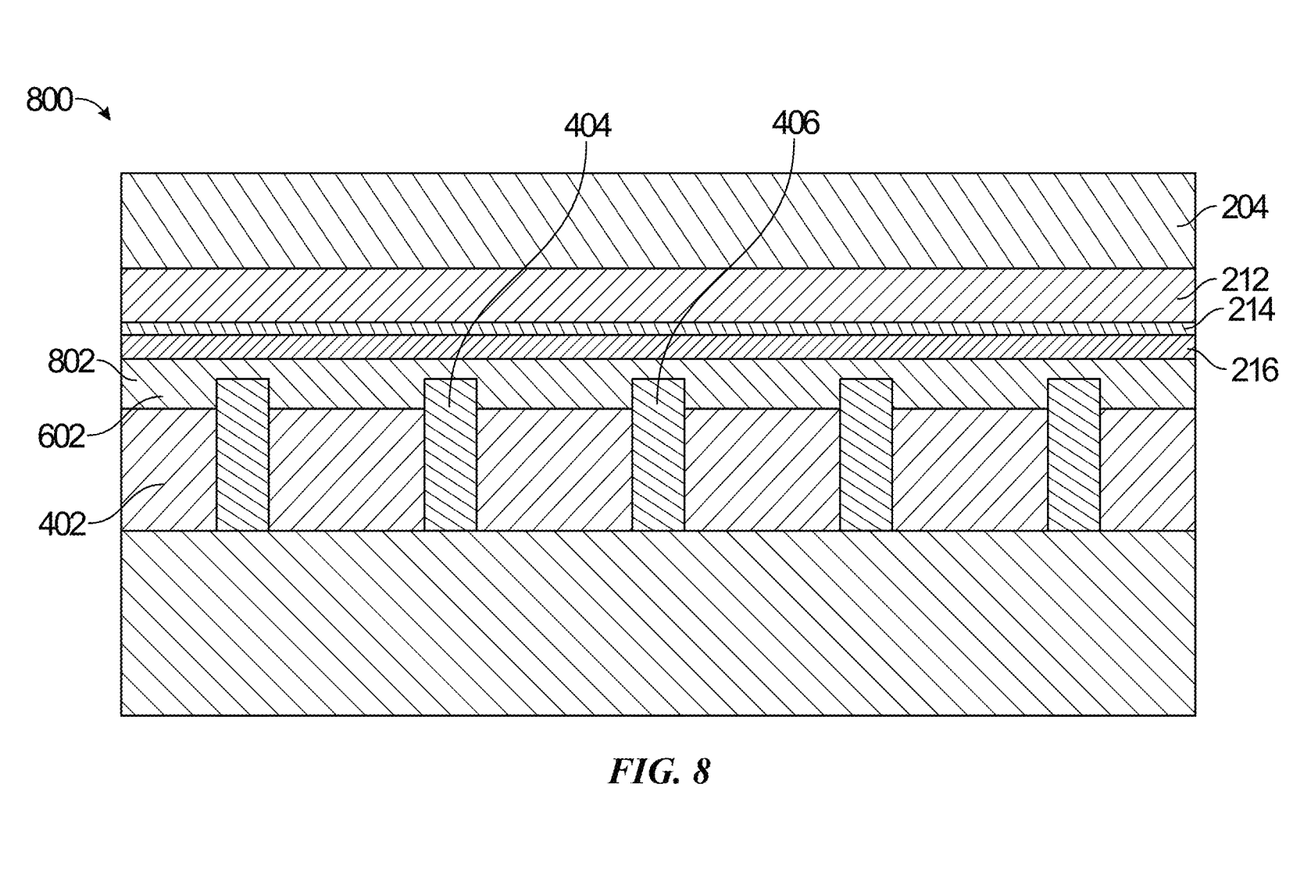

At 308, form a structure 800, which is shown in FIG. 8, by depositing a second layer 802 of SOT material, the free layer 216, the barrier layer 214, the pinned layer 212, and the top electrode 204. The second layer 802 will form the upper step 222 of the SOT layer 210, following additional processing in step 312. For the free layer and the pinned layer, suitable materials include CoFeB or MgO based materials. For the top electrode, suitable materials include TiN, TaN, W, etc. It can be seen that in the structure 800, the second layer 802 covers the bars 406 as well as the pillars 404.

Figure 9:
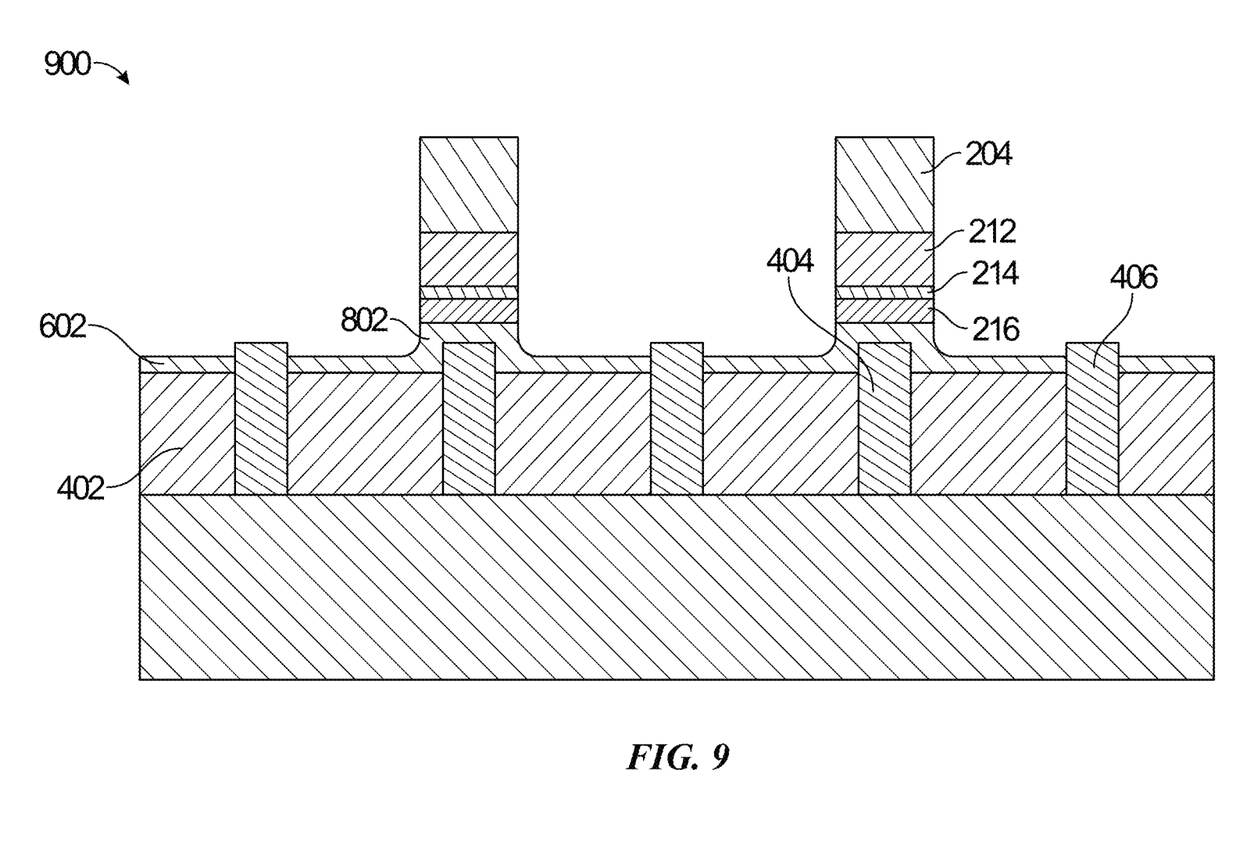

At 310, form a structure 900, which is shown in FIG. 9, by depositing a dielectric hard mask (HM) (SiN, $SiO_x$, $Si_xB_yC_zN_t$, etc.) (not shown) and patterning by lithography, reactive ion etching or ion-beam etching with a stop on the lower step 224 of the SOT layer 210 (seen in FIG. 2). This etching step defines the MTJ stack 208 (seen in FIG. 2). In one or more embodiments, anisotropic etching (e.g., reactive ion etching (RIE) or ion beam etching (IBE)) is used to remove the material in order to reveal the MTJ stack 208. In the prior art, the etching step is where the undesirable bridges 118 often were formed by back-sputtering of etched SOT metal onto the edges of the barrier layer. Back-sputtering is a common side effect of RIE or IBE. However, according to exemplary embodiments, the lower steps 224 of the SOT layer 210 provide additional thickness. Accordingly, it is possible to etch the structure 800 of FIG. 8 sufficiently far down so as to remove any bridges that might otherwise be formed on edges of the barrier layer 214, without impairing (increasing) the electrical resistance of the SOT layer 210 to read and write currents. Additionally, etching the structure 800 results in the SOT layer 210 not covering the bars 406 in the structure 900; thus, as intended, the bars 406 can set boundaries for the MRAM 200.

At 312, complete the MRAM 200 by encapsulating with the dielectric 218 (seen in FIG. 2) and also forming interconnect layers 220 (seen in FIG. 2). The ordinary skilled worker will be familiar with dielectric materials (e.g., silicon oxide, silicon nitride, silicon carbide) and with interconnects, their purposes and shapes, and appropriate interconnect materials (e.g., copper, tungsten, ruthenium, aluminum, silver).

Figure 10:
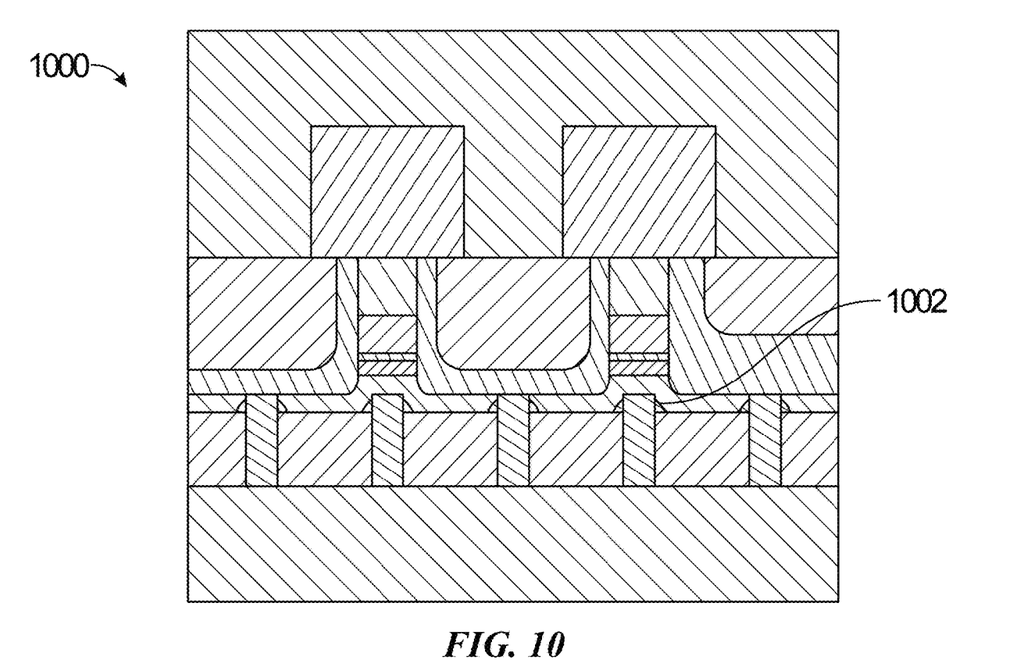
FIG. 10 depicts, in a schematic, an alternate embodiment of the SOT MRAM that is shown in FIG. 2.
Figure 11:
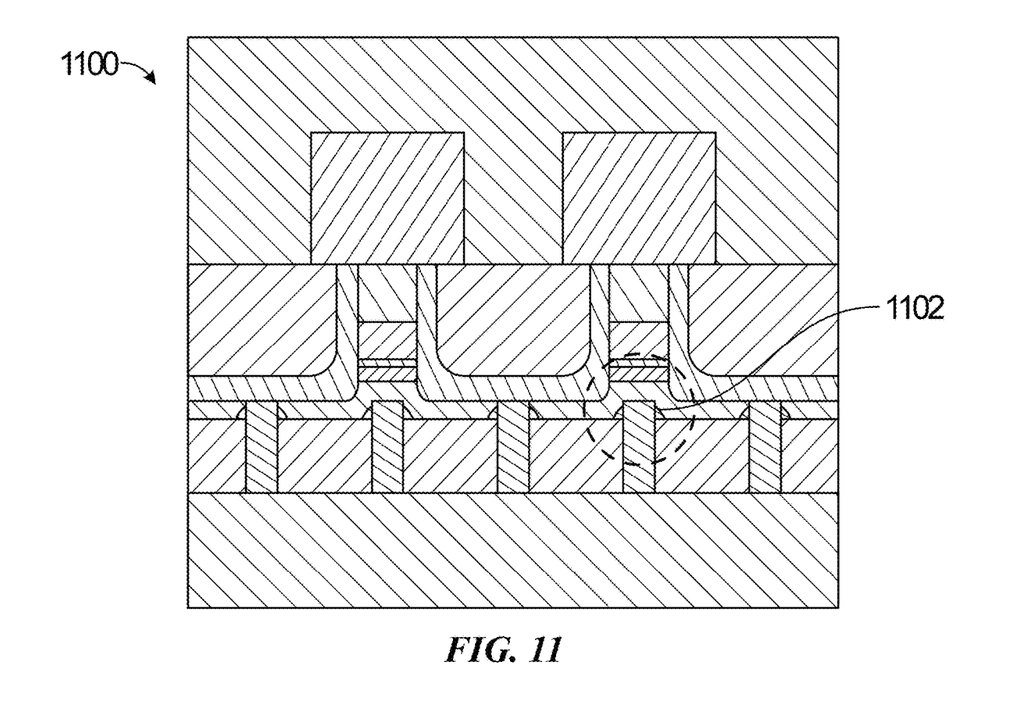
FIG. 11 depicts, in a schematic, another alternate embodiment of the SOT MRAM that is shown in FIG. 2.

In one or more embodiments, the dielectric pillar 404 may include spacers that further improve uniformity of the thickness of the stepped SOT layer 210. For example, in a structure 1000 as shown in FIG. 10, the pillar 404 may include convex spacers 1002. On the other hand, in a structure 1100 as shown in FIG. 11, the pillar 404 may include concave spacers 1102. The ordinary skilled worker is familiar with methods for forming spacers on the sides of structures during fabrication of semiconductor devices.

Given the discussion thus far, it will be appreciated that, in general terms, an exemplary magnetic random access memory (MRAM) apparatus 200 includes a magnetic tunnel junction (MTJ) stack 208; a spin-orbit-torque (SOT) layer 210 that underlies the MTJ stack, wherein the SOT layer has a stepped profile; and a dielectric pillar 404 that underlies the SOT layer and the MTJ stack.

In one or more embodiments, the MTJ stack includes a pinned layer 212, a barrier layer 214, and a free layer 216. Each layer has horizontal edges, and edges of the barrier layer are free of metal bridges.

In one or more embodiments, the edges of the MTJ stack protrude outward beyond a periphery of the dielectric pillar.

In one or more embodiments, the SOT layer 210 has an upper step 222 directly under the MTJ stack and overlying the dielectric pillar, lower steps 224 below and to either side of the upper step, and risers 226 that connect the lower steps to the upper step.

In one or more embodiments, the dielectric pillar has spacers 1002 at a top end thereof, and the spacers impose a convex shape on the risers. In one or more embodiments, the dielectric pillar has spacers 1102 at a top end thereof, and the spacers impose a concave shape on the risers.

In one or more embodiments, the lower steps of the SOT layer have upper surfaces that are flush with an upper surface of the dielectric pillar, while the upper step of the SOT layer is coextensive with the MTJ stack.

In one or more embodiments, the lower steps of the SOT layer are of a same thickness as the upper step of the SOT layer. In one or more embodiments, the risers of the SOT layer are of a same thickness as the lower steps and the upper step. In one or more embodiments, the upper and lower steps and the risers all are composed of a same material.

In one or more embodiments, the apparatus also includes a dielectric base 402 that surrounds the dielectric pillar; and dielectric bars 406 that protrude from the dielectric base at edges of the SOT layer 210.

According to another aspect, an exemplary method 300 includes, at 302, forming a dielectric base 402 of a first dielectric material and a dielectric pillar 404 of a second dielectric material, wherein the dielectric pillar protrudes from the dielectric base; at 304, forming a first intermediate structure by depositing a first layer 602 of conductive material onto the dielectric base, sufficiently thick to cover the pillar and the base; at 306, forming a planarized structure 700 by planarizing the first intermediate structure to reveal the pillar; and, at 308, depositing a second layer of spin-orbit-torque metal 802 onto the planarized structure.

In one or more embodiments, the method 300 also includes, at 310, depositing additional layers onto the second layer of spin-orbit-torque metal, wherein the additional layers comprise a free layer, a barrier layer, and a pinned layer; and forming a magnetic tunnel junction stack atop the pillar, without bridges on edges of the barrier layer, by etching the additional layers and the second layer of spin-orbit-torque metal around the pillar.

In one or more embodiments, the method also includes etching through the second layer of spin-orbit-torque metal down to the first layer of spin-orbit-torque metal. In one or more embodiments, the method also includes etching into the first layer of spin-orbit-torque metal.

In one or more embodiments, etching the additional layers and the second layer of spin-orbit-torque metal includes etching the additional layers with at least one first ion; and etching the second layer of spin-orbit-torque metal with a second ion that is different than any of the at least one first ions.

In one or more embodiments, the method also includes, before depositing the first layer of spin-orbit-torque metal, forming spacers at a protruding upper end of the pillar. In one or more embodiments, forming spacers includes forming convex spacers. In one or more embodiments, forming spacers includes forming concave spacers.

According to another aspect, an exemplary magnetic random access memory (MRAM) apparatus includes a magnetic tunnel junction (MTJ) stack 208; and a spin-orbit-torque (SOT) layer 210 underlying the MTJ stack. The SOT layer 210 has an upper step 222 directly under the MTJ stack and a lower step 224 adjacent to and below the upper step. The upper step comprises spin-orbit-torque metal.

In one or more embodiments, the lower step of the SOT layer comprises spin-orbit-torque metal. In one or more embodiments, the upper and lower steps of the SOT layer are of uniform thickness. In one or more embodiments, the upper step of the SOT layer is coextensive with the MTJ stack.

In one or more embodiments, the apparatus also includes a dielectric base 402 that underlies the lower step of the SOT layer; and a dielectric pillar 404 that protrudes from the dielectric base beneath the MTJ stack and the upper step of the SOT layer. In one or more embodiments, the apparatus also includes dielectric bars 406 that protrude from the dielectric base at edges of the lower step of the MTJ stack.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A magnetic random access memory (MRAM) apparatus comprising:
   a magnetic tunnel junction (MTJ) stack;
   a spin-orbit-torque (SOT) layer underlying the MTJ stack, wherein the SOT layer has a stepped profile; and a dielectric pillar underlying the SOT layer and the MTJ stack,
wherein the SOT layer covers the dielectric pillar and has a generally uniform thickness.

2. The apparatus of claim 1,
wherein the MTJ stack comprises a pinned layer, a barrier layer, and a free layer,
wherein each of the pinned layer, the barrier layer, and the free layer has horizontal edges, and
wherein edges of the barrier layer are free of metal bridges.

3. The apparatus of claim 2, wherein the edges of the MTJ stack protrude outward beyond a periphery of the dielectric pillar.

4. The apparatus of claim 1, wherein the SOT layer comprises:
an upper step directly under the MTJ stack and overlying the dielectric pillar;
lower steps below and to either side of the upper step; and
risers connecting the lower steps to the upper step.

5. The apparatus of claim 4,
wherein the dielectric pillar comprises spacers at a top end thereof, and
wherein the spacers impose a convex shape on the risers.

6. The apparatus of claim 4,
wherein the dielectric pillar comprises spacers at a top end thereof, and
wherein the spacers impose a concave shape on the risers.

7. The apparatus of claim 4, wherein:
the lower steps of the SOT layer have upper surfaces that are flush with an upper surface of the dielectric pillar, and
the upper step of the SOT layer is coextensive with the MTJ stack.

8. The apparatus of claim 7, wherein the lower steps of the SOT layer are of a same thickness as the upper step of the SOT layer.

9. The apparatus of claim 8, wherein the risers of the SOT layer are of a same thickness as the lower steps and the upper step.

10. The apparatus of claim 4, wherein the upper and lower steps and the risers all are composed of a same material.

11. The apparatus of claim 1, further comprising:
a dielectric base that surrounds the dielectric pillar; and
dielectric bars that protrude from the dielectric base at edges of the SOT layer.

12. A method comprising:
forming a dielectric base of a first dielectric material and a dielectric pillar of a second dielectric material, wherein the dielectric pillar protrudes from the dielectric base;
forming a first intermediate structure by depositing a first layer of conductive material onto the dielectric base, sufficiently thick to cover the pillar and the base;
forming a planarized structure by planarizing the first intermediate structure to reveal the pillar; and
depositing a second layer of spin-orbit-torque metal onto the planarized structure.

13. The method of claim 12, further comprising:
depositing additional layers onto the second layer of spin-orbit-torque metal, wherein the additional layers comprise a free layer, a barrier layer, and a pinned layer; and
forming a magnetic tunnel junction stack atop the pillar, without bridges on edges of the barrier layer, by etching the additional layers and the second layer of spin-orbit-torque metal around the pillar.

14. The method of claim 13, further comprising:
etching through the second layer of spin-orbit-torque metal down to the first layer of conductive material.

15. The method of claim 14, further comprising:
etching into the first layer of conductive material.

16. The method of claim 13, wherein etching the additional layers and the second layer of spin-orbit-torque metal comprises:
etching the additional layers with at least one first ion; and
etching the second layer of spin-orbit-torque metal with a second ion that is different than any of the at least one first ions.

17. The method of claim 13, further comprising:
before depositing the first layer of spin-orbit-torque metal, forming spacers at a protruding upper end of the pillar.

18. The method of claim 17, wherein forming spacers comprises forming convex spacers.

19. The method of claim 17, wherein forming spacers comprises forming concave spacers.

20. A magnetic random access memory (MRAM) apparatus comprising:
a magnetic tunnel junction (MTJ) stack; and
a spin-orbit-torque (SOT) layer underlying the MTJ stack,
wherein the SOT layer has an upper step covering an area directly under the MTJ stack and a lower step adjacent to and below the upper step,
wherein the upper step comprises spin-orbit-torque metal, and
wherein the SOT layer has a generally uniform thickness.

21. The apparatus of claim 20, wherein the lower step of the SOT layer comprises spin-orbit-torque metal.

22. The apparatus of claim 20, wherein the upper and lower steps of the SOT layer are of uniform thickness.

23. The apparatus of claim 20, wherein the upper step of the SOT layer is coextensive with the MTJ stack.

24. The apparatus of claim 20, further comprising:
a dielectric base that underlies the lower step of the SOT layer; and
a dielectric pillar that protrudes from the dielectric base beneath the MTJ stack and the upper step of the SOT layer.

25. The apparatus of claim 24, further comprising:
dielectric bars that protrude from the dielectric base at edges of the lower step of the MTJ stack.

26. The apparatus of claim 24, wherein the upper step of the SOT layer and the MTJ stack extend laterally beyond a periphery of the dielectric pillar.

* * * * *